United States Patent [19]
Emesh et al.

[11] Patent Number: 5,358,889
[45] Date of Patent: Oct. 25, 1994

[54] FORMATION OF RUTHENIUM OXIDE FOR INTEGRATED CIRCUITS

[75] Inventors: Ismail T. Emesh, Cumberland; David R. McDonald, Ottawa, both of Canada

[73] Assignee: Northern Telecom Limited, Montreal, Canada

[21] Appl. No.: 53,755

[22] Filed: Apr. 29, 1993

[51] Int. Cl.$^5$ .................................. H01L 21/70
[52] U.S. Cl. ........................ 437/60; 437/201; 437/919
[58] Field of Search .............. 428/209; 427/96; 437/196, 187, 201, 47, 60, 919; 257/532; 361/321

[56] References Cited

U.S. PATENT DOCUMENTS

| | | | |
|---|---|---|---|
| 3,850,668 | 11/1974 | Heffer | 428/408 |
| 4,000,346 | 12/1976 | Dowell | 428/336 |
| 5,003,428 | 3/1991 | Shepherd | 361/321 |
| 5,155,658 | 10/1992 | Inam et al. | 361/321 |

OTHER PUBLICATIONS

Plasma Etching of RuO2 Thin Films, Saito, et al, Jpn. J. Appl. Phys., vol. 31 (1992) Pt. 1, No. 1.

*Primary Examiner*—Tom Thomas
*Attorney, Agent, or Firm*—Angela C. de Wilton

[57] ABSTRACT

A method is provided for forming a conductive layer of ruthenium oxide layer RuO$_2$. The RuO$_2$ layer is formed from a coating of a precursor solution comprising a ruthenium (III) nitrosyl salt, subsequent heat treatment, and annealing at low temperature. The resulting layer of a tetragonal phase of crystalline ruthenium oxide is suitable for formation thereon of a perovskite structure ferroelectric material for applications in ferroelectric non-volatile memory cells. The chloride free process is compatible with processing for submicron device structures for bipolar, CMOS or bipolar CMOS integrated circuits.

12 Claims, 1 Drawing Sheet

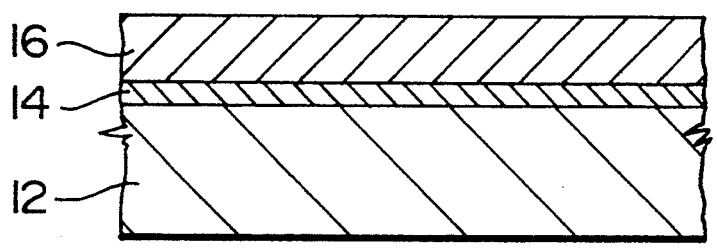
FIG.IA
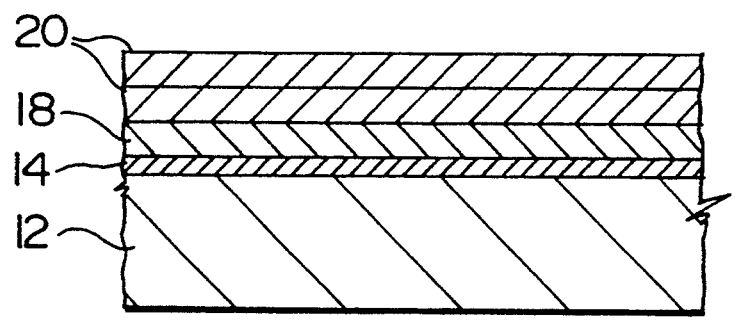
FIG.IB
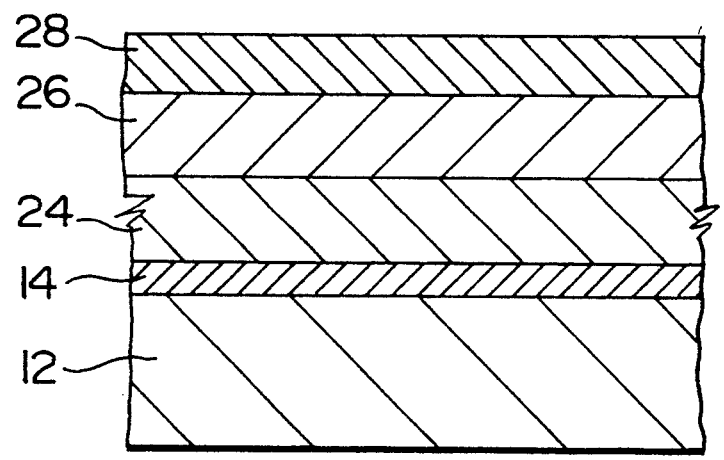
FIG.IC

FORMATION OF RUTHENIUM OXIDE FOR INTEGRATED CIRCUITS

FIELD OF THE INVENTION

This invention relates to a method of forming ruthenium oxide, with application for fabrication of integrated circuits.

BACKGROUND OF THE INVENTION

In development of non-volatile memories and DRAMS for integrated circuits, memory storage capacity of each generation of DRAM increases, and the area of individual memory cells decreases. To maintain sufficient capacitance in each cell for charge storage, deep trench isolated electrode may be used to increase the capacitor plate area. On the other hand, since the dielectric constant of conventional capacitor dielectrics, typically silicon dioxide is low, (about 4), interest has turned to dielectrics having higher dielectric constants which include ferroelectric materials such as ferroelectric perovskites of the general formula $ABO_3$, e.g. lead zirconium titanate, strontium titanate, barium titanate, etc.

However, problems of poor adhesion or unwanted interfacial diffusion of impurities may occur when incorporating materials such as lead titanate zirconate (PZT) thin films into conventional capacitor structures in bipolar and CMOS processes for fabrication of integrated circuit devices.

The selection of appropriate conductive electrode materials and barrier layers between the electrode material and ferroelectric capacitor dielectric is a critical factor in fabrication of ferroelectric memory cells to avoid undesirable interfacial diffusion and reactions.

Noble metals have been used as capacitor electrodes, for example Pt has been used as a bottom electrode. However a major drawback is the rather high temperature of 700° C. during processing which is required to initialize the formation of a ferroelectric perovskite phase on a platinum electrode. Other electrode materials such as Au or Ni alloys result in formation of $Au_2O_3$ or NiO insulating layers at the electrode/ferroelectric interface, and are thus unsuitable. Al or Al alloys cannot be used due to the problem of oxide formation at the interface, and also because of their low melting temperature they are incompatible with processing temperatures above 700° C. required for crystallization of the ferroelectric perovskite. Indium tin oxide has been used, but this material initiates the formation of a PbO rich phase at the interface with PZT. Electrodes such as W, Ti, or doped Si result in poor adhesion of the PZT layer upon crystallization. While stainless steel has been used as a substrate, it is unsuitable for VLSI applications.

Various metals and conducting metal oxides, e.g. Ru and their oxides have been proposed as barrier layers between a more conventional electrode material, e.g. polysilicon, and the ferroelectric PZT layer to prevent undesirable interfacial diffusion and reactions.

Furthermore, a metal oxide layer, e.g. cuprate oxide or bismuthal oxide having a perovskite structure has been found to aid crystal growth thereon of a perovskite ferroelectric, as described in U.S. Pat. No. 5,155,658 to Inam issued Oct. 13, 1992, entitled "Crystallographically Aligned Ferroelectric Films Usable In Memories and Method of Crystallographically Aligning Perovskite Films".

As described in U.S. Pat. No. 5,003,428 to Shepherd entitled "Electrodes For Ceramic Oxide Capacitors", ruthenium oxide is a conductive electrode material which is suitable for use in ferroelectric capacitors. Ruthenium oxide is an oxide having tetragonal rutile structure with unit cell dimension of a=4.49Å and c=3.11Å, which would be expected to initiate the crystallization of a perovskite ferroelectric phase of PZT at lower temperatures than normally observed on materials lacking a tetragonal structure, i.e. W, Pt, Al and Au have cubic structures.

Further, PZT and $RuO_2$ have been shown to display negligible interdiffusion at temperatures less than 500° C.

Various conventional methods are known for forming $RuO_2$. $RuO_2$ may be prepared by oxidation of Ru metal at 1250° C., oxidation of $RuCl_3$ at 900° C. and chemical vapour deposition (CVD) from volatile oxides at 1090° C. Lower temperature methods of $RuO_2$ film formation include the deposition of a ruthenium trichloride titanium tetra-n-butoxide solution onto a Ti substrate followed by heating. It may also be formed by the deposition of a ruthenium trichloride/ammonium molybdate solution onto a $SnO_2$ substrate followed by heating at 400° C. Films have also been prepared recently by sputtering techniques as noted in the above mentioned U.S. Pat. No. 5,003,428 to Shepherd.

In a publication in Japanese Journal of Applied Physics, Vol. 31, page 135, January 1992, there is mentioned a metallo-organic deposition from ruthenium octyrate in 4-methyl-2-pentanon at 600° C.

For use of $RuO_2$ in integrated circuits, deposition temperatures must preferably be below 700° C. to avoid thermal damage to integrated circuit elements. Also, because chloride ions may have a deleterious effect on Si based integrated circuits, a chloride free process is desirable.

SUMMARY OF THE INVENTION

The present invention seeks to provide and method of forming conductive ruthenium oxide films for application in integrated circuit fabrication, and particularly for electrodes of ferroelectric memory cells.

According to one aspect of the present invention, there is provided a method of forming a conductive layer of ruthenium oxide for an integrated circuit, the method comprising: coating an integrated circuit substrate with a layer of an aqueous solution of a precursor comprising a ruthenium (III) nitrosyl salt, and subsequently heat treating the layer to form a phase of ruthenium oxide.

The steps of coating with precursor solution and heating may be repeated, if required, to build up a layer of a required thickness of ruthenium oxide.

Preferably the resulting film is annealed at between 300° C. to 700° C. to induce crystallization of the film to form a tetragonal phase of ruthenium oxide.

Thus there is provided a low temperature and chloride ion free process by which $RuO_2$ may be reproducibly deposited on an appropriate substrate, compatible with fabrication of integrated circuits by conventional CMOS and bipolar process technologies.

According to a further aspect of the present invention there is provided a method of forming a conductive layer of ruthenium oxide for an integrated circuit comprising: coating an integrated circuit substrate with a layer of an aqueous solution comprising, by weight:

10–80% of a ruthenium (III) nitrosyl salt solution 2-50% of a water soluble viscosity modifier
1-30% of a volatile organic acid;
and then heating the layer to a temperature between 200° C. and 400° C. to form a layer of amorphous ruthenium oxide on the substrate surface.

Thus, the precursor solution is conveniently provided as a viscous aqueous solution which may be spin-coated onto a substrate using conventional known coating apparatus. Furthermore, components of the solution are chloride free and otherwise compatible with fabrication of silicon integrated circuits.

According to another aspect of the present invention there is provided a method of forming an integrated circuit capacitor structure on a semiconductor substrate, comprising: forming a first electrode comprising conductive metal oxide; forming a layer of a perovskite ferroelectric material thereon; and forming a second electrode; wherein the step of forming the conductive metal oxide layer comprises coating the substrate with a layer of an aqueous precursor solution comprising a ruthenium (III) nitrosyl salt, and then heat treating the layer at a temperature below 450° C. to form a layer comprising an amorphous ruthenium oxide phase, and subsequently annealing the amorphous ruthenium oxide layer to form a crystalline phase of ruthenium oxide.

Thus a method is provided for forming conductive ruthenium oxide electrodes which is compatible with integrated circuit fabrication, and particularly for application for ferroelectric memory capacitors.

Thus the present invention provides a method of forming ruthenium oxide for an integrated circuit and a method of forming a capacitor for an integrated circuit in which the above mentioned problems are avoided or reduced.

BRIEF DESCRIPTION OF THE DRAWINGS

An embodiment of the invention will now be described by way of example, with reference to the accompanying drawings, in which:

FIGS. 1A, 1B and 1C show a schematic cross-sectional view through part of an integrated circuit structure at successive stages of a method according to an embodiment of the present invention.

DESCRIPTION OF THE PREFERRED EMBODIMENT

FIGS. 1A to 1C show, schematically, successive steps in a method of forming a capacitor structure for an integrated circuit including formation an electrode comprising a conductive layer 24 of ruthenium oxide formed according to an embodiment of the invention.

A substrate for an integrated circuit substrate is provided in the form of a semiconductor silicon wafer 12, having formed thereon a layer 14 of a dielectric material, typically silicon dioxide. If desired, an adhesion layer, e.g. Ti or TiN, may be provided on the substrate. A coating 16 of a precursor solution comprising a ruthenium (III) nitrosyl salt in a viscous aqueous mixture is spun onto the substrate and heat treated at a low temperature between about 150° C. and 200° C., to decompose the ruthenium precursor, drive off volatile components of the solution, and thereby form a layer 18 of amorphous ruthenium oxide. The ruthenium loading and viscosity of the precursor solution is selected to provide a layer of ruthenium oxide 18 of a desired thickness. If required, the steps of coating and heat treating are repeated to add additional layers 20 to provide a required thickness of amorphous ruthenium oxide.

The amorphous ruthenium oxide layer is then annealed, typically by rapid thermal annealing in an inert or oxygen ambient at a temperature above 300° C., for a sufficient time to form a layer 24 of a crystalline, tetragonal phase of ruthenium oxide, $RuO_2$. Preferably the annealing takes place at a temperature below 700° C. to avoid adverse thermal effects, e.g. undesirable diffusion or reactions in the substrate.

The composition of the ruthenium precursor solution typically comprises an aqueous solution comprising, by weight: 10-80% of a dilute (0.5-10%) ruthenium (III) nitrosyl salt solution; 2-50% of a water soluble viscosity modifier; 1-30% of a volatile organic acid.

The ruthenium (III) nitrosyl salt solution is typically a nitrate salt in a dilute nitric acid solution although other salts in appropriate acids may alternatively be used. The water soluble viscosity modifier is typically glycerol, ethylene glycol, or other polyfunctional alcohol, but solution of polyvinyl alcohol, polyethylene glycol or other water soluble polymers of wide range of molecular weights may be used. The volatile organic acid may include, for example, formic acid, acetic acid, propionic acid, and others, and functionalized acids such a lactic acid.

The ruthenium oxide forms a conductive layer which is patterned to form first electrodes of capacitors. Subsequently, a layer 26 of a perovskite ferroelectric material, i.e. PZT is provided on the crystalline ruthenium oxide electrodes by a sol-gel process. For example, after formation of the layer of crystalline $RuO_2$, a layer of PZT was deposited onto the $RuO_2$ layer by a sol-gel process, that is, by spin coating a layer or multilayers of a PZT precursor sol-gel onto the substrate wafer followed by baking of the film at low temperature (200° C. to 450° C.) for several minutes to drive off volatile organics and form an amorphous PZT layer. The PZT is then converted to the ferroelectric crystalline phase by a rapid thermal annealing in an $O_2$ atmosphere at a temperature between about 500° C. and 600° C. A layer 28 of an appropriate conductive top electrode material is then deposited thereon and patterned to form capacitor top electrodes.

EXAMPLE

A precursor solution was prepared by mixing 50g of a solution of 1.5% Ru (III) nitrosyl nitrate in dilute nitric acid (pH 3), 30 g of glycerol and 15 g of acetic acid and then filtering the solution through a 0.22 μm filter. This solution was applied to a substrate comprising a 150 mm semiconductor silicon wafer having a surface layer of $SiO_2$, by applying approximately 2 ml of precursor solution to the wafer surface and spin-coating at 2500 rpm for 20 seconds, using conventional commercially available apparatus.

The wafer was baked at 200° C. for 2 minutes to provide a layer of amorphous $RuO_2$ of approximately 60-70 Å thickness. The steps of spin-coating and baking were repeated to build up a coating of a desired thickness. By repeating the coating steps 10 times, and subsequently annealling the amorphous layer by rapid thermal annealing (RTA) at 600° C. for 30 seconds, a crystalline film of $RuO_2$, 0.6 μm thick was provided. The resistivity of the resulting $RuO_2$ layer was 116 μΩ.cm. The uniformity of the film, as measured by variation in the resistivity of the film across a wafer was ±2%.

Samples were preferably annealed at a temperature between 400° C. and 600° C. for about 30 seconds.

Upon heating of the ruthenium containing film to about 200° C., the film was found by analysis by Fourier Transform Infrared FTIR Absorption Spectroscopy to lose uncoordinated water, acetic acid and glycerol. Heating of a sample to 400° C. was shown to result in complete decomposition of the ruthenium precursor to provide RuO$_2$ as determined by EDX.

The grain size of the crystallized ruthenium oxide layer was measured by TEM and was 10 to 20 nm for annealing by R.T.A. at 450° C. and 2 to 10 nm for annealing by R.T.A. at 350° C.

The films were found to contain no detectable carbon, and exhibited resistivities of 100 to 150 $\mu\Omega$.cm with ±2% variation across a 150 mm diameter wafer.

The thickness of the layer of RuO$_2$ may be controlled by increasing the percentage of Ru compound in the solution or by increasing the viscosity of the solution. Thinner layers can be produced by reducing the loading of the Ru compound or reducing the viscosity of the solution.

The ruthenium precursor is found to undergo rapid hydrolysis in water as follows:

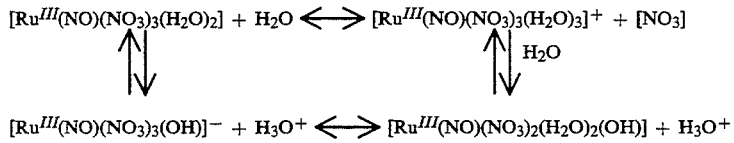

Acetic acid is added to the solution and its function is to drive the equilibrium towards nitrate loss (upper right). Acetic acid also improves the surface wetting properties of the solution and therefore helps to eliminate streaking in the film. It may also function as a bidentate ligand and displace coordinated water or nitrate to form complexes.

Glycerol, for example, is added to modify the viscosity so that solution may be applied by spin-coating. Glycerol, due to its hydroxyl moieties, may also function as a weak ligand, depending on the pH and the characteristics of the other ligands present. It is also thought that the glycerol may form an extensive hydrogen bonding network in the solution between the various cationic complexes present, which would aid in the drying process.

Although particular embodiments of the present invention have been described in detail, it should be appreciated that numerous modifications, variations and adaptations may be made to the embodiments without departing from the scope of the invention as defined in the claims.

What is claimed is:

1. A method of forming a conductive layer of ruthenium oxide for an integrated circuit, the method comprising:
    coating an integrated circuit substrate with a layer of an aqueous solution comprising a water soluble ruthenium (III) nitrosyl salt, a water soluble viscosity modifier, and a volatile organic acid, and subsequently heating the layer to a temperature in the range from 150° C. to 200° C. to form an amorphous phase of ruthenium oxide.

2. A method of forming a conductive layer of ruthenium oxide for an integrated circuit, the method comprising:
    coating an integrated circuit substrate with a layer of an aqueous solution comprising a water soluble ruthenium (III) nitrosyl salt, a water soluble viscosity modifier, and a volatile organic acid;
    heating the layer to a temperature in the range from 150° C. to 200° C. to form an amorphous phase of ruthenium oxide; and
    subsequently annealing the layer at a temperature above 300° C. and below 700° C. for a sufficient time to cause crystallization of the amorphous ruthenium oxide to a tetragonal phase.

3. A method according to claim 2 wherein the ruthenium III nitrosyl salt solution consists of a nitrate salt in dilute nitric acid solution, the viscosity modifier consists of glycerol and the organic acid consists of acetic acid.

4. A method of forming a conductive layer of ruthenium oxide for an integrated circuit comprising:
    coating an integrated circuit substrate with a layer of an aqueous solution comprising, by weight:
    10–80% of a ruthenium (III) nitrosyl salt solution
    2–50% of a water soluble viscosity modifier
    1–30% of a volatile organic acid;
    and then heating the layer to a temperature between 150° C. and 400° C. to form a layer of ruthenium oxide on the substrate surface.

5. A method according to claim 4 comprising repeating the steps of coating with precursor solution and heating to build up a ruthenium oxide layer of a required thickness.

6. A method according to claim 4 comprising subsequently annealing the amorphous ruthenium oxide layer at between 300° C. and 700° C. to induce crystallization of the layer to form a tetragonal phase of ruthenium oxide (RuO$_2$).

7. A method according to claim 4 wherein the water soluble viscosity modifier is selected from the group consisting of glycerol, ethylene glycol, polyvinyl alcohol, and polyethylene glycol.

8. A method according to claim 4 wherein the volatile organic acid is selected from the group consisting of acetic acid, formic acid, propionic acid and lactic acid.

9. A method of forming an integrated circuit capacitor structure on a semiconductor substrate, comprising:
    forming a first electrode comprising conductive metal oxide;
    forming a layer of a perovskite ferroelectric material thereon; and
    forming a second electrode; wherein the step of forming the conductive metal oxide layer comprises coating the substrate with a layer of an aqueous precursor solution comprising a ruthenium (III) nitrosyl salt, and then heat treating the layer at a temperature below 450° C. to form a layer comprising an amorphous ruthenium oxide phase, and
    subsequently annealing the amorphous ruthenium oxide layer to form a crystalline phase of ruthenium oxide.

10. A method according to claim 9 wherein the aqueous precursor solution comprises, by weight:
    10–80% of a ruthenium (III) nitrosyl salt solution
    2–50% of a water soluble viscosity modifier 1–30% of a volatile organic acid;
and after coating the substrate with a layer of said precursor solution, heat treating the layer comprises heating to a temperature between 200° C. and 400° C. to form the layer of ruthenium oxide on the substrate surface.

11. A method according to claim 10 comprising repeating the steps of coating with precursor solution and heating to build up a ruthenium oxide layer of a required thickness.

12. A method according to claim 10 wherein subsequently annealing the amorphous ruthenium oxide layer comprises heating to a temperature between 300° C. and 700° C. for a sufficient time to induce crystallization of the layer to form a tetragonal phase of ruthenium oxide ($RuO_2$).

* * * * *